(12) United States Patent
Yano

(10) Patent No.: US 8,767,464 B2
(45) Date of Patent: Jul. 1, 2014

(54) SEMICONDUCTOR MEMORY DEVICES, READING PROGRAM AND METHOD FOR MEMORY DEVICES

(75) Inventor: Masaru Yano, Tokyo (JP)

(73) Assignee: Winbond Electronics Corp., Taichung (TW)

( * ) Notice: Subject to any disclaimer, the term of this patent is extended or adjusted under 35 U.S.C. 154(b) by 364 days.

(21) Appl. No.: 13/296,693

(22) Filed: Nov. 15, 2011

(65) Prior Publication Data

US 2012/0230106 A1    Sep. 13, 2012

(30) Foreign Application Priority Data

Mar. 9, 2011    (JP) .................................. 2011-51167

(51) Int. Cl.
*G11C 16/04*    (2006.01)

(52) U.S. Cl.
USPC ............. 365/185.11; 365/185.17; 365/185.23

(58) Field of Classification Search
CPC ....... G11C 16/10; G11C 16/102; G11C 16/26
USPC ........................... 365/185.11, 185.17, 185.23
See application file for complete search history.

(56) References Cited

U.S. PATENT DOCUMENTS

| 7,061,802 B2 * | 6/2006 | Nakai ...................... 365/185.13 |
| 7,212,447 B2 * | 5/2007 | Aritome ................... 365/185.25 |

* cited by examiner

*Primary Examiner* — Tha-O H Bui
(74) *Attorney, Agent, or Firm* — Muncy, Geissler, Olds & Lowe, P.C.

(57) ABSTRACT

A semiconductor memory device, having a memory array which has two memory banks which can be accessed simultaneously is provided. A word line selection circuit selects the word line according to the row address information, and a controller controls the word line selection circuit according to the received instruction. The controller performs the first read operation of the word line selection circuit in response to a first read command, and performs the second read operation of the word line selection circuit in response to a second read command. The first read operation selects the n-th word line of one of the memory banks and selects the (n+1)-th or (n−1)-th word line of the other memory bank, and the second read operation selects the n-th word line of one of the memory banks and selects the n-th word line of the other memory bank.

11 Claims, 10 Drawing Sheets

|  | erase | white | read |
|---|---|---|---|
| selected word line | 0 | 15~20V | 0 |
| not selected word line | F | 10V | 4.5 |
| gate selection line SGD | F | Vcc | 4.5 |
| gate selection line SGS | F | 0 | 4.5 |
| common source line SL | F | Vcc | 0 |
| P well | 21 | 0 | 0 |

FIG. 3 flexible reading page normal read page

SEMICONDUCTOR MEMORY DEVICES, READING PROGRAM AND METHOD FOR MEMORY DEVICES

CROSS REFERENCE TO RELATED APPLICATIONS

This Application claims priority of Japan Patent Application No. 2011-51167, filed on Mar. 9, 2011, the entirety of which is incorporated by reference herein.

BACKGROUND OF THE INVENTION

1. Field of the Invention

The disclosure relates generally to a semiconductor memory device, and more particularly relates to NAND flash memory devices, and methods for reading data.

2. Description of the Related Art

Recently, application of a flash memory with SPI (Serial peripheral Interface), required 512 Mb, 1 Gb or more highly integrated. At the same time, lower costs are also being required for memory units, such as flash memory NANDs.

Even with the smallest NAND flash memory array size, address transition thereof, is still slower than that of a NOR memory. Therefore, a continuous read operation of a wrap-around causes problems. FIGS. 9a-9d shows a schematic diagram illustrating an embodiment of a reading operation of a conventional flash memory device. In reading the wrap-around operation, for example, as shown in FIG. 9a, the n-th page of memory array MA is selected. The data read from the n-th page is transferred to the page buffer PB and then, as shown in FIG. 9b, the data which is stored in the page buffer PB is transmitted to external sequentially. As shown in FIG. 9c, then the (n+1)-th page selected. The data read from the (n+1)-th page is transferred to the page buffer PB and then, as shown in FIG. 9d, the data stored in the page buffer PB is transmitted to external continually. Thus, before reading the data of the (n+1)-th page, reading of the data of the n-th page must be finished. In other words, when sequentially reading the data of the n-th page is almost finished, then the (n+1)-th page selected. If the (n+1)-th page contains the management data D1 of the data related to the n-th page, the delay time for accessing the management data D1 is long.

The purpose of the invention is to solve the above conventional problems, and to provide a semiconductor memory device with flexible and fast data reading.

BRIEF SUMMARY OF THE INVENTION

An embodiment of a semiconductor memory device, comprises: a memory cell array having at least two memory banks, wherein the memory banks can be accessed simultaneously. Each of the memory banks comprises a plurality of memory cells formed in columns and rows. The gates of each row of the memory cells are coupled to each word line in common respectively. Each column of the memory cells is coupled to each bit line respectively; a first receive device for receiving address information; a second receive device for receiving a command related to an access operation; a word line selection device for decoding column address information received by the first receive device, and selecting a word line according to a decoding result; and a controller device controlling the word line selection device according to the command received by the second receive device. The controller device instructs the word line selection device to perform a first read operation according to a first read command, and instructs the word line selection device to perform a second read operation according to a second read command. The first read operation selects the n-th word line of one of the memory banks and selects the (n+1)-th or (n−1)-th word line of the other one of the memory banks. The second read operation selects the n-th word line of one of the memory banks and selects the n-th word line of the other one of the memory banks.

An embodiment of a memory device reading program for a semiconductor memory device is provided, wherein the semiconductor memory device comprises: a memory cell array having at least two memory banks, wherein the memory banks can be accessed simultaneously. Each of the memory banks comprises a plurality of memory cells formed in columns and rows. The gates of each row of the memory cells are coupled to each word line in common respectively. Each column of the memory cells is coupled to each bit line respectively. A word line selection device selects a word line according to a decoding result row address information. The program comprises the steps of: identifying a read command is a first read command or a second read command; if the read command is the first read command, the word line selection device performs a first read operation; and if the read command is the second read command, the word line selection device performs a second read operation, wherein the first read operation selects the n-th word line of one of the memory banks and selects the (n+1)-th or (n−1)-th word line of the other one of the memory banks. The second read operation selects the n-th word line of one of the memory banks and selects the n-th word line of the other one of the memory banks.

An embodiment of a semiconductor memory device reading method for a semiconductor memory device is provided, wherein the semiconductor memory device comprises: a memory cell array having at least two memory banks, wherein the memory banks can be accessed simultaneously. Each of the memory banks comprise a plurality of memory cells formed in columns and rows. The gates of each row of the memory cells are coupled to each word lines in common respectively. Each column of the memory cells is coupled to each bit line respectively. A word line selection device selects a word line according to a decoding result row address information. The method comprises the steps of: identifying a read command is a first read command or a second read command; if the read command is the first read command, performing a first read operation by the word line selection device; and if the read command is the second read command, performing a second read operation by the word line selection device, wherein the first read operation selects the n-th word line of one of the memory banks and selects the (n+1)-th or (n−1)-th word line of the other one of the memory banks and the second read operation selects the n-th word line of one of the memory banks and selects the n-th word line of the other one of the memory banks.

BRIEF DESCRIPTION OF DRAWINGS

FIG. 3 is a table for illustrating an embodiment of voltage conditions for erasing, writing and reading;

DETAILED DESCRIPTION OF THE INVENTION

In the invention, the read operation is performed more flexible and the data read is faster by using the first and second read operation selectively.

The embodiment of the invention will become more fully understood by referring to the following detailed description with reference to the accompanying drawings.

Figure 1:
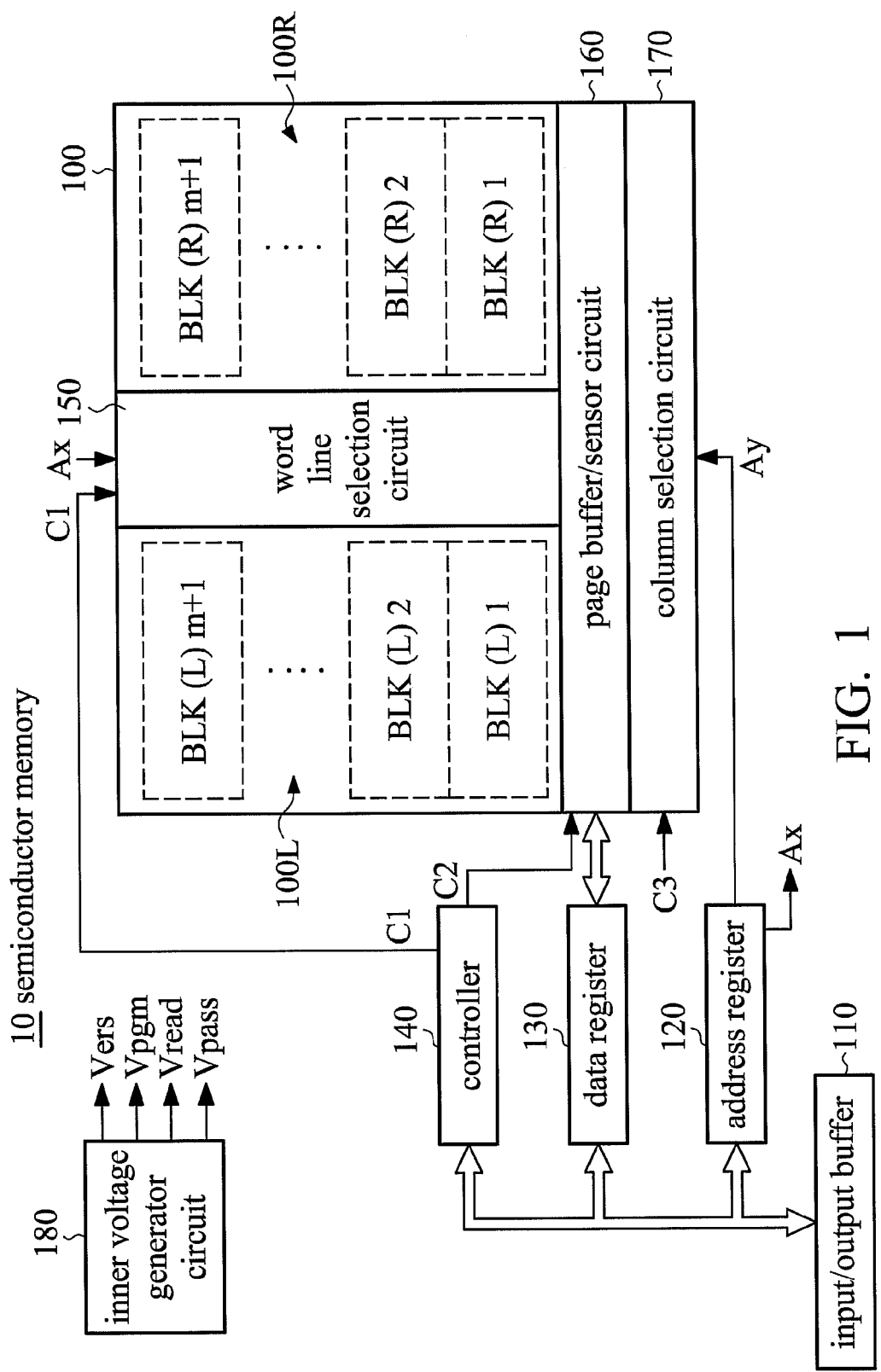
FIG. 1 is a block diagram illustrating an embodiment of a NAND semiconductor memory device.

FIG. 1 is a block diagram illustrating an embodiment of a NAND semiconductor memory device. The semiconductor memory 10 of the embodiment comprises a memory array 100 has a plurality of memory cells formed in rows and columns, an input/output buffer 110 storing input/output data from the external input/output terminal I/O, an address register 120 receiving an address data of the input/output buffer 110, a data register 130 storing input/output data, a controller 140 receiving command data from the input/output buffer 110 and controlling every element according to the command data, a word line selection circuit 150 selecting a block and word line according to the decoding result row address information Ax, a page buffer/sensor circuit 160 storing the data read from the selected page and the data written in the selected page, a column selection circuit 170 selecting a bit line according to the decoding result column address information Ay from the address register 120, and an inner voltage generator circuit 180 generating voltages needed for reading, programming, and erasing data.

An embodiment of the invention of the memory array 100 comprises two memory banks 100L, 100R. For convenience, the left memory bank is marked "L" or "left side", and the right memory bank is marked "R" or "right side". The memory banks 100L and 100R are formed by a substantially same cell layout. This means that the memory bank 100L has m+1 blocks (BLK(L)1, BLK(L)2, . . . , BLK(L)m+1) in the column direction, and the memory bank 100R has m+1 blocks (BLK(R)1, BLK(R)2, . . . , BLK(R)m+1) in the column direction.

Figure 2:
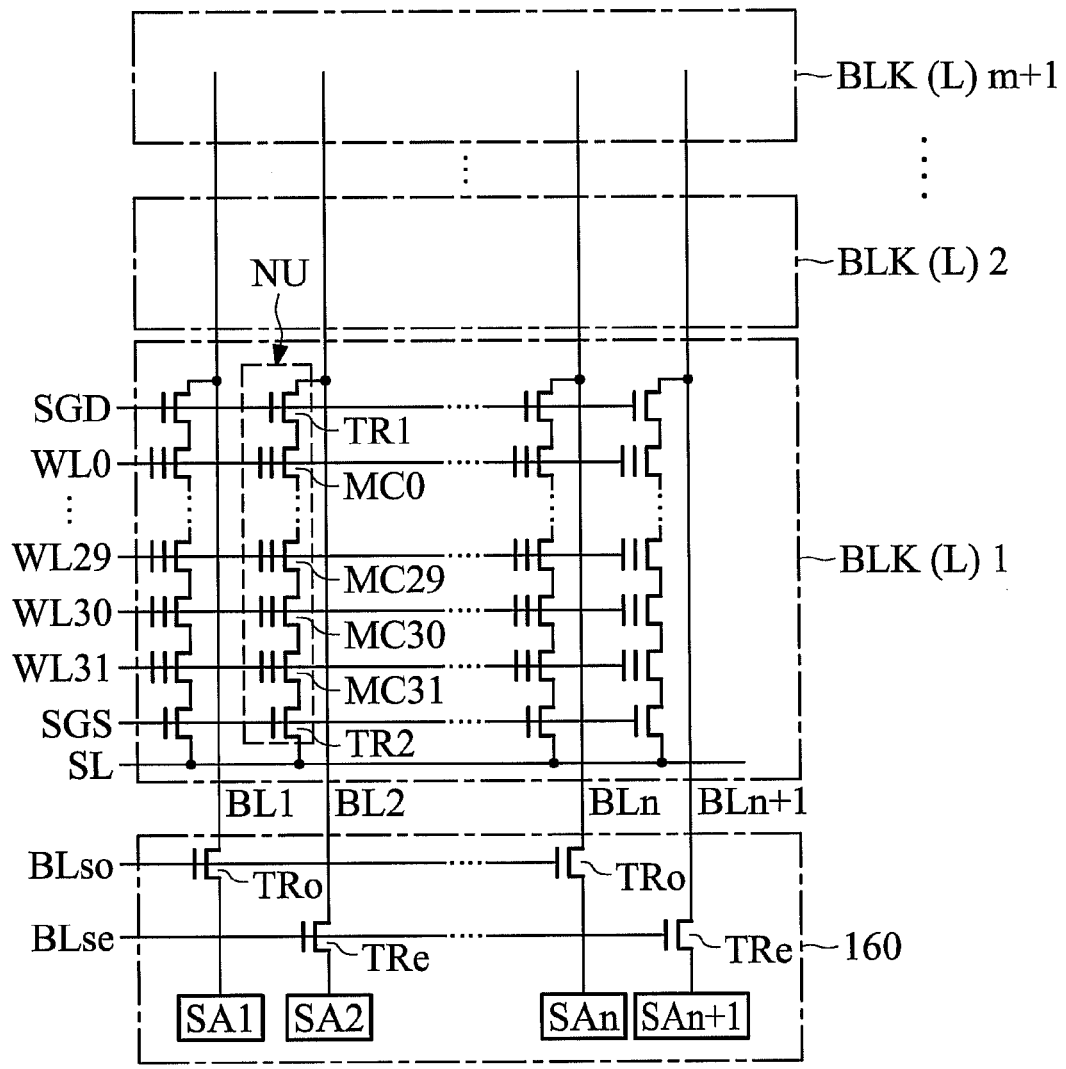
FIG. 2 is a circuit forming diagram of an embodiment of the memory array shown in FIG. 1.

FIG. 2 is a circuit forming diagram of an embodiment of the memory array shown in FIG. 1. The memory bank 100L has a plurality of blocks (BLK(L)1, BLK(L)2, . . . , BLK(L) m+1) in the direction of the bit line BL, and each of the blocks is coupled to the bit line BL with n bits. The block BLK(L)1 has a plurality of NAND cell units (or a "cell unit NU"), wherein the cell units NU are arranged in the row direction. As shown in the diagram, each cell unit NU comprises a plurality of memory cells MCi (in the embodiment, i=0, 1, . . . , 31) coupled in series, a selection transistor TR1 and a selection transistor TR2 electrically connect to two ends of the memory cells. Each cell unit NU is electrically connected to corresponding bit line BL respectively. The drain of the selection transistor TR1 is coupled to the bit line BL, and the source of the election transistor TR2 is coupled to a common source line SL.

Control gates of the memory cells MCi in the cell units NU are coupled to each word line WLi respectively. Each gate of selection transistors TR1, TR2 is electrically connected to the gate selection lines SGD, SGS parallel to the word line WL.

As shown in the diagram, a block is formed by n cell units NU, and a set of memory cells share a word line in the block constitute a page. That means one page of one side has n bits. Note that a set of n cell units NU sharing a word line and gate selection lines SGD, SGS constitute a block for erasing data. Further, the word line selection circuit 150 turns on the selection transistors TR1, TR2 to select a block by the gate selection lines SGD, SGS. Furthermore, although it is not shown, the memory bank 100R has a memory bank array configuration similar to that of the memory bank 100L.

The bit lines (BL1, BL2, . . . , BLn, BLn+1) coupled to each cell unit NU of memory bank 100L are electrically connected to the sensor amplifier circuits (SA1, SA2, . . . , SAn, SAn+1) of the page buffer/sensor circuit 160 via the bit line selection circuit. The column selection circuit comprises an odd bit line selection transistor TRo for selecting odd numbers of the bit lines, and an even bit line selection transistor TRe for selecting even numbers of the bit lines. The sensor amplifier circuits (SA1, SA3 . . . , SAn) corresponding to odd numbers of the bit line (BL1, BL3 . . . , BLn) are coupled to the odd bit line selection transistor TRo. To turn on/off the odd bit line selection transistor TRo is controlled by the odd bit line selection signal BLSo which is coupled to the gate of the odd bit line selection transistor TRo. The sensor amplifier circuits (SA2, SA4 . . . , SAn−2) corresponding to even numbers of the bit line (BL2, BL4 . . . , BLn−2) are coupled to the even bit line selection transistor TRe. To turn on/off the even bit line selection transistor TRe is controlled by the even bit line selection signal BLSe which is coupled to the gate of the even bit line selection transistor TRe. The even bit line selection signal BLSe and the odd bit line selection signal BLSo are driven by the controller 140 or the column selection circuit 170. When the even bit line selection signal BLSe and the odd bit line selection signal BLSo are driven via the high voltage level, the even bit line selection transistor TRe and the odd bit line selection transistor TRo will be turned on, and the sensor amplifier circuits will sensor the data which is read from the bit line and work as a page buffer to buffer the data which is written into the memory cell. Note that although it is not shown, the memory bank 100R is similarly coupled to the page buffer/sensor circuit 160 having n bits.

Referring to FIG. 1, the input/output buffer 110 transmits data between the address register 120, the data register 130, and the controller 140. The command, data, and address information are sent from a memory controller (not shown) to the address register 120, the data register 130, and the controller 140. Note that while reading, the data read from the page buffer/sensor circuit 160 is sent to the input/output buffer 110 via the data register 130.

The controller 140 controls the reading, programming or erasing process according to the command date received from the input/output buffer 110. For example, the controller 140 identifies the address information and the written data according to the command data, wherein the address information is transmitted by the word line selection circuit 150 or column selection circuit 170, and the written data is transmitted by the page buffer/sensor circuit 160.

The word line selection circuit 150 decodes the upper bits of the row address information from the address register 120, and turns on the selection transistors TR1, TR2 by the gate selection lines SGD, SGS according to the decoding result. Thus, a pair of blocks can be selected simultaneously in a row direction of the memory banks 100L, 100R. Note that the word line selection circuit 150 decodes the remaining bits, selects the word lines of the pair of blocks according to the decoding result, and provides required voltages to the selected word line and the word line not selected. Each page of the pair of blocks is selected in the memory banks 100L, 100R as described above. In short, the word line selection circuit 150 accesses two pages simultaneously.

In an embodiment of invention, the word line selection circuit 150 performs different read operations according to a control signal C1 of a controller 140. In an embodiment of the invention, the memory controller (not shown) can send two read commands to the semiconductor memory 10. In a preferred embodiment, the first read command is a flexible page selection for selecting the pages which are in adjacent rows of the selected pair of blocks, and the second read command is a normal page selection for selecting the pages which are in the same row of the selected pair of blocks.

As shown in FIG. 1, the page buffer/sensor circuit 160 is coupled to the data register 130, transmits data which was read to the data register 130 according to the read/write command, and then receives the write data from the data register 130. The column selection circuit 170 decodes the column address information Ay from the address register 120, and selects data which is stored in the page buffer/sensor circuit 160 or a bit line.

The inner voltage generator circuit 180 is controlled by the controller 140, and generates voltages needed for each access operation. For example, a write voltage Vpgm for the selected word line, a voltage Vpass for the word line not selected while programming, a read voltage Vread for both the gate selection line and the word line not selected while reading, and an erasing voltage Vers for the P well formed by the memory array while erasing. Note that the voltage Vpass is different from the read voltage Vread. The voltage generator circuit can further have a driving voltage Vsg generator circuit for providing sufficient voltage to turn on the selection transistors.

The write voltage Vpgm is used for the selection memory cell having a channel set to 0V, and is also required for injection of electrons into the floating gate by FN tunneling from the channel. The voltage Vpass and the read voltage Vread are required to turn on the data stored in the not selected memory cell. The voltage Vpass, the read voltage Vread and driving voltage Vsg are required to turn on the selection transistors. The write voltage Vpgm, voltage Vpass, read voltage Vread, and driving voltage Vsg in response to the operation mode of the inner voltage generator circuit 180 are corresponding to the selecting of the word line selection circuit 150, corresponding word line of the memory array and the gate selection lines SGS, SDS according to the address information and the operation mode.

For example, when reading the word line WL30 of the block BLK(L), the selected word line WL30 is provided with a read voltage Vread of 0V, and the other word lines are provided with the read voltage Vread of 4.5V. The gate selection line SGD is provided with a voltage of 4.5V, the gate selection line SGS is provided a voltage of 4.5V, and the common source line SL is provided a voltage of 0V. Further, while writing the page of the word line WL30, the word line WL30 is provided with the write voltage Vpgm of 15~20V, and the other word lines are provided with the voltage Vpass of 10V. The gate selection line SGD is provided a voltage of Vcc, the gate selection line SGS is provided a voltage of 0V, and the common source line SL is provided a voltage of 0V. FIG. 3 is a table for illustrating an embodiment of voltage conditions for erasing, writing and reading, wherein the "F" stands for floating.

Figure 4:
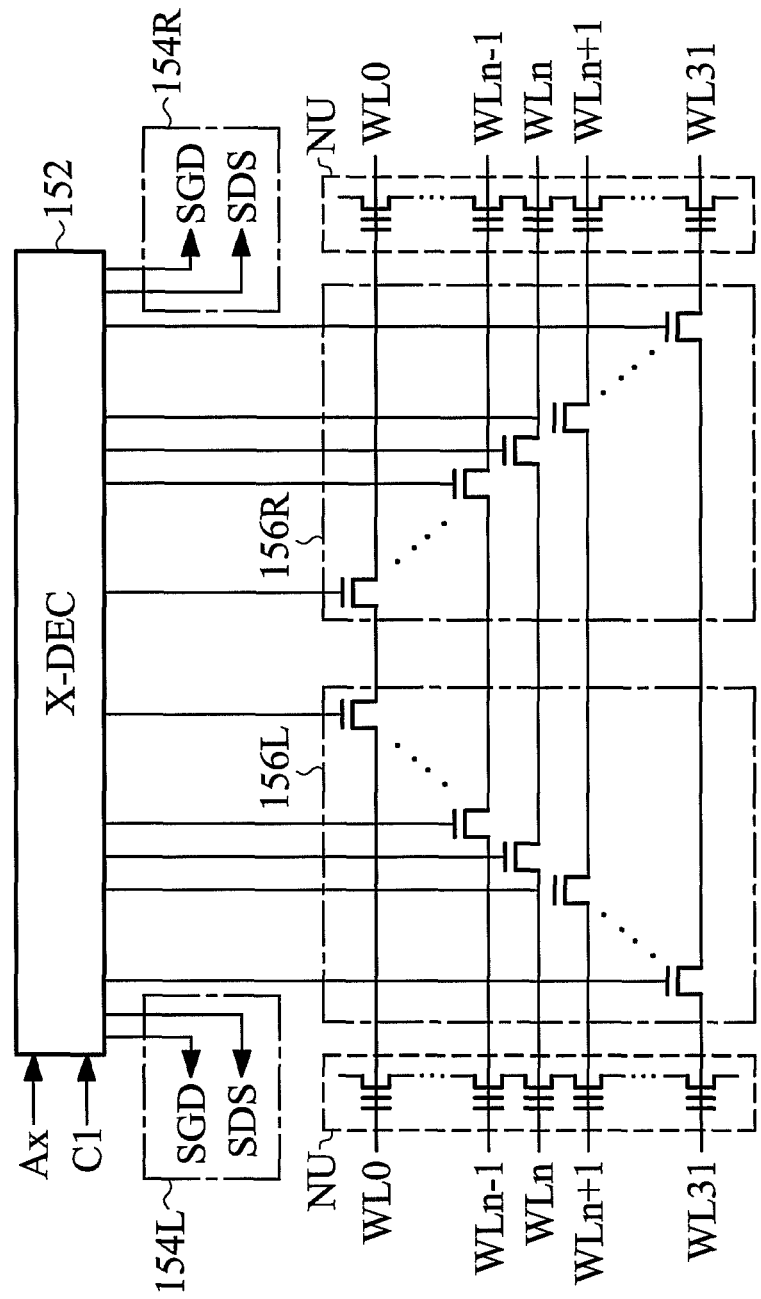
FIG. 4 is a schematic diagram illustrating an embodiment of a part of the word line selection circuit 150.

FIG. 4 is a schematic diagram illustrating an embodiment of a part of the word line selection circuit 150. The word line selection circuit 150 has a decoder unit 152 for decoding the column address information Ax, block selection units 154L, 154R for selecting a block according to the decoding result from the decoder unit 152, and word line driving units 156L, 156R according to the decoding result from the decoder unit 152.

In order to select a block within the memory banks 100L and 100R, the block selection units 154L, 154R turn on the selection transistors TR1, TR2 via the gate selection line SGD, SGS. Thus, the cell unit NU of the block which is selected are electrically connected to the bit lines (BL1, BL2 . . . , BLn+1).

Note that while the controller 140 sends the first command, namely flexible page reading, the flag is set to logic "1". While the controller 140 sends the second command, namely normal page reading, the flag is set to logic "0". The control signal C1 provides the logic value of the flag to the decoder unit 152.

Figure 5A:
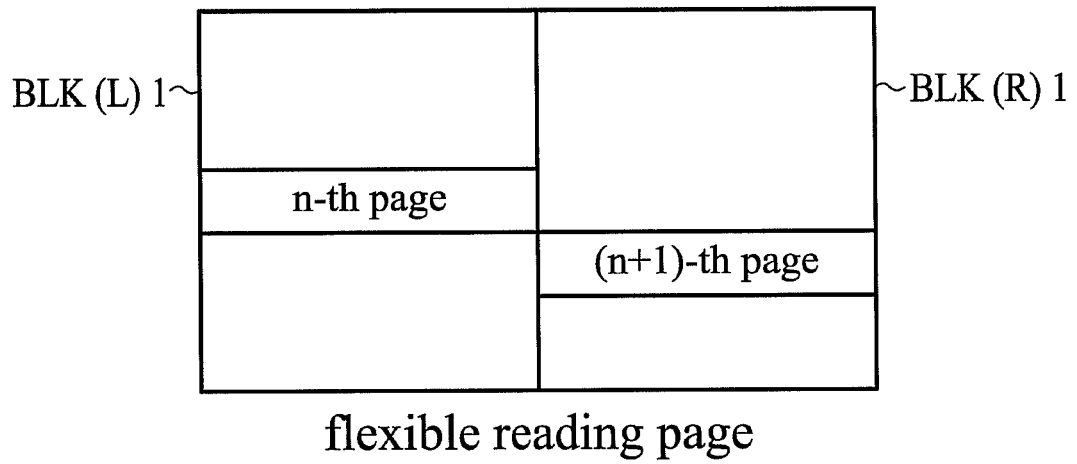
FIG. 5a, 5b are a schematic diagram illustrating an embodiment of the flexible page reading operation and the normal page reading operation.

When the control signal C1 with logic "1" is received by the decoder unit 152, the flexible page reading operation will be performed. FIG. 5a is a schematic diagram illustrating an embodiment of the flexible page reading operation. The decoder unit 152 selects the n-th word line (n-th page) of the block BLK(L)1 which is selected, and selects the (n+1)-th word line ((n+1)-th page) of the block BLK(R)1 which is selected. In response of that, the word line driving unit 156L provides a voltage of 0V to the n-th word line and a read voltage of 4.5V to the word lines not selected, and the word line driving unit 156R provides a voltage of 0V to the (n+1)-th word line and a read voltage of 4.5V to the word lines not selected (refer to the table of FIG. 3).

Figure 5B:
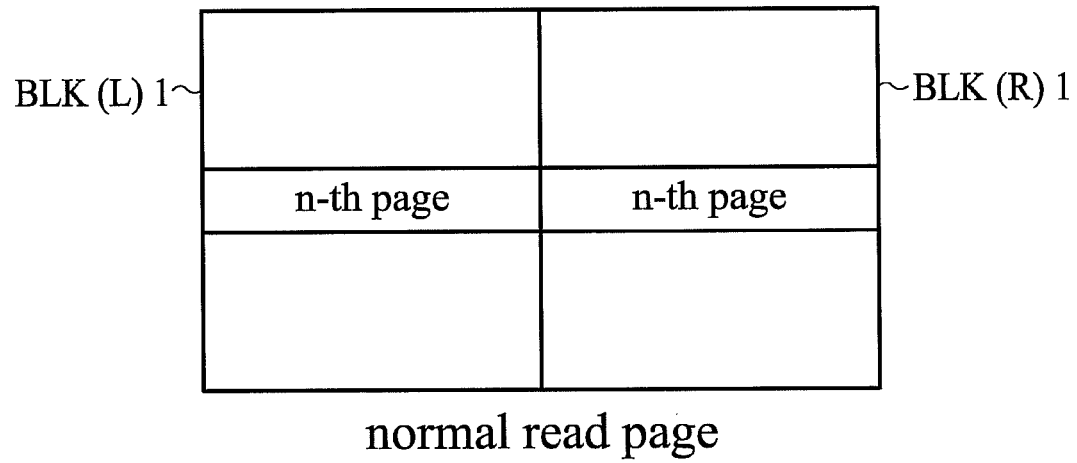

When the control signal C1 with logic "0" is received by the decoder unit 152, the normal page reading operation will be performed. FIG. 5b is a schematic diagram illustrating an embodiment of the normal page reading operation. The word line driving units 156L provides a voltage of 0V to the n-th word line of the block BLK(L)1 which is selected and a read voltage of 4.5V to the word lines not selected. The word line driving units 156R provides a voltage of 0V to the n-th word line of the block BLK(R)1 which is selected and a read voltage of 4.5V to the word lines not selected.

For example, the decoder unit 152 comprises a counter controlled by the control signal C1. While the control signal C1 is logic "1", the word lines of the block BLK(L)1 are selected in an increasing or decreasing order. While the control signal C1 is logic "0", the counter stops counting in an increasing or decreasing order. Of course, the decoder unit 152 may be formed by other circuits except the counter, and it is able to switch between selecting the word line in an increasing (n+1) and decreasing (n−1) order. Note that the order of selection of the right page could be increasing (n+1) or decreasing (n−1), and the order of selection of the left page could be increasing (n+1) or decreasing (n−1), too.

Figure 6:
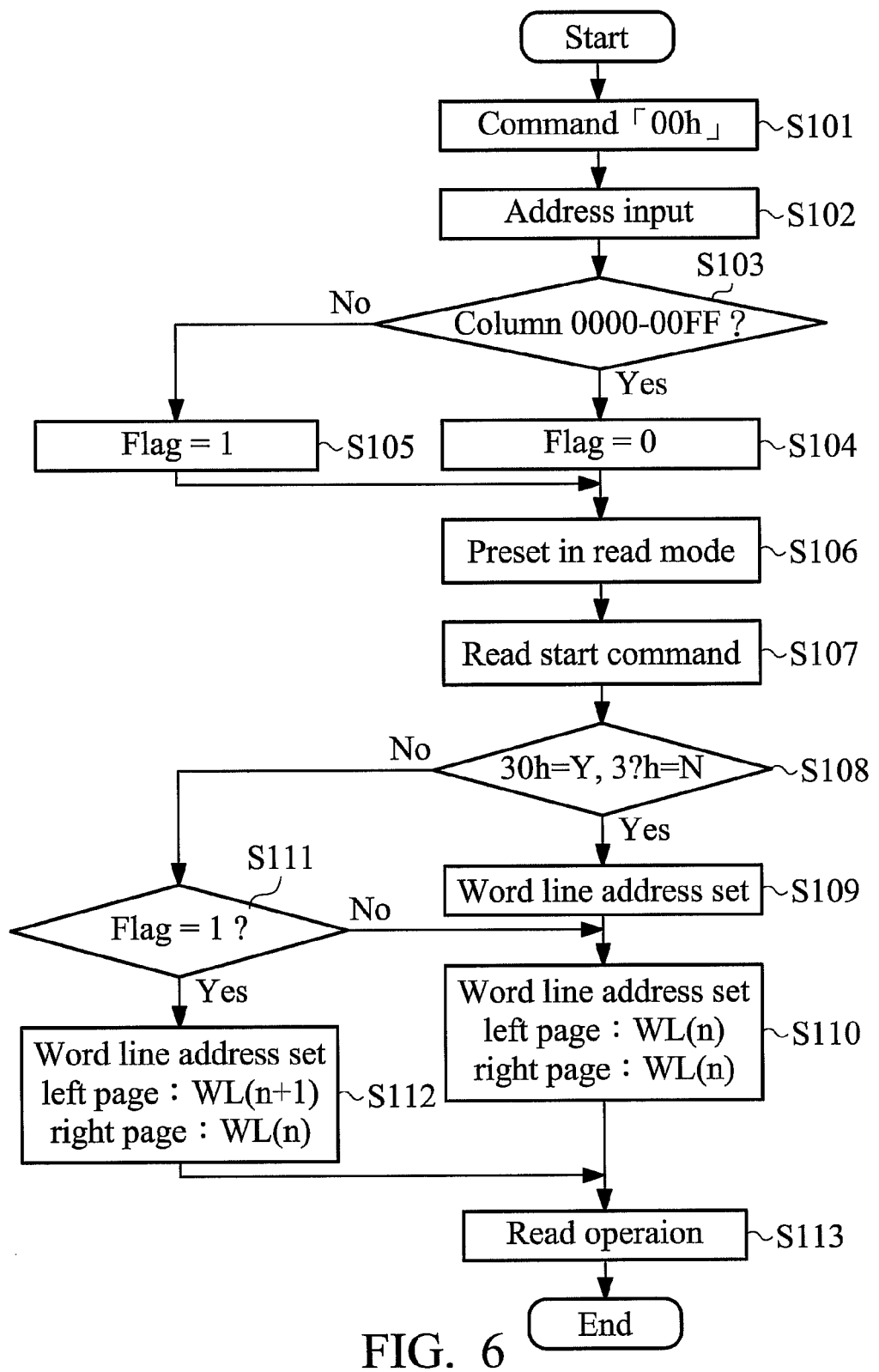
FIG. 6 is a flowchart of an embodiment of the reading operation of the invention.

Next, a following detailed description of an embodiment of the invention is illustrated with reference to the flowchart of FIG. 6. At first, the controller 140 analyzes the read command "00h" in response to the command latch enable signal (S101), and sets the column address and row address to the address register 120 (S102). And then, the controller 140 determines whether the column address information Ay is within the range of 0000-00FF the left page of the memory bank 100L (S103).

When the column address information Ay is determined to be within the range of left page, the controller 140 sets the flag to "0" (S104). When the column address information Ay is not determined to be within the range of left page, namely is within the right page, the controller 140 sets the flag to "1" (S105), and then, the controller 140 is preset to the read mode (S106).

The controller 140 receives the read start command in response to the command latch enable signal, and determines whether the command is the first read command "3?h" or the second read command "30h" (S108). If the command is the second read command, the controller 140 sets the address of the word line of the word line selection circuit 150 (S109). In other word, the controller 140 selects the n-th word lines of both the left page and right page. On the other hand, if the command is the first read command, the word line selection circuit 150 selects the n-th word line of the left page and the (n+1)-th word line of the right page according to the control signal C1 (S112). The left page and the right page are read according to the selection of the word line (S113). The data transmitted to the page buffer is sent to the data register 130 in an increasing order of page address.

Figure 7A:
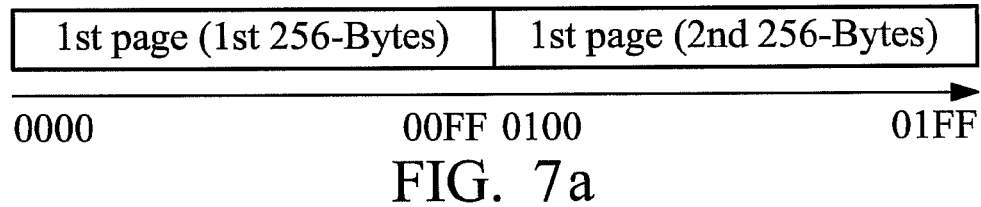
FIG. 7a-7d are clock pulse diagrams illustrating an embodiment of a flexible page reading operation.
Figure 7B:
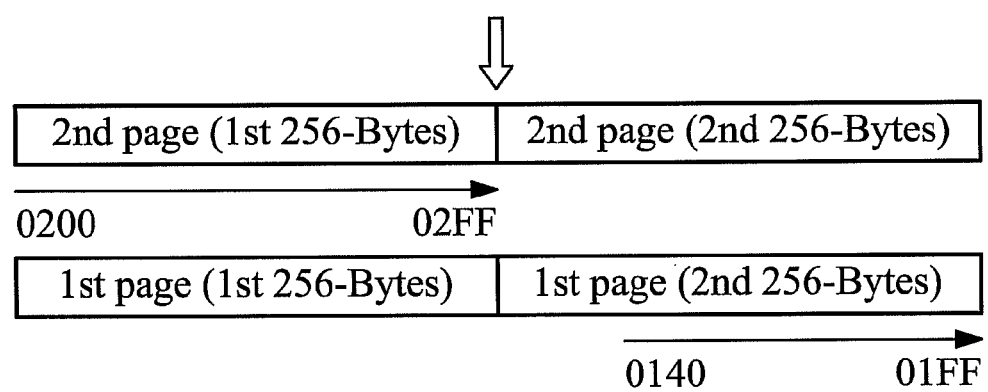
Figure 7C:
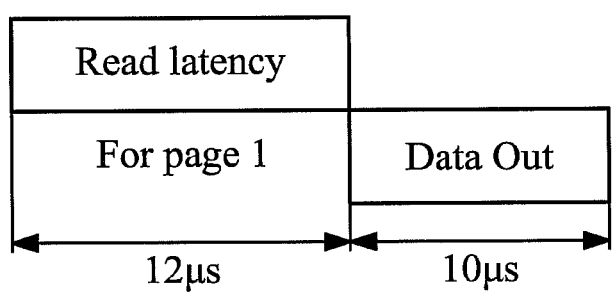

FIG. 7a-7d are diagrams illustrating an embodiment of a flexible page reading operation, FIG. 8a-8d are diagrams illustrating an embodiment of a normal page reading operation. FIG. 7a is a diagram illustrating an embodiment of each memory banks 100L, 100R having 256 bytes. Regarding the wrap-around reading operation, the latency is set to 512 bytes, and the data of two pages stored in the page buffer is sent to the external in order. For this, the time of setting the column address and sending the pages selected by memory banks 100L, 100R to the page buffer is about 12 μs. If the frequency of reading 1 bit data from the page buffer is 50 MHz, to output 512 bits of data would require 10 μs. Thus, as shown in FIG. 7c, it takes about 22 μs to read the selected page.

Figure 7D:
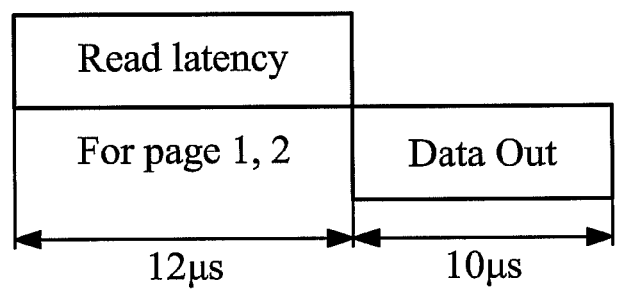

FIG. 7b is a diagram illustrating an embodiment of the second page selected in the left page and the first page selected in the right page. As shown in FIG. 7d, 22 μs is needed to read the data from the column address "0140".

Figure 8A:
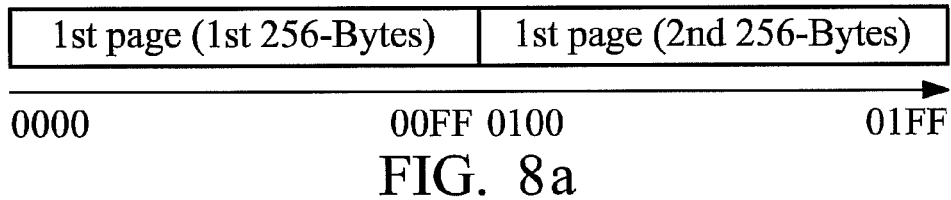
FIG. 8a-8d are clock pulse diagrams illustrating an embodiment of a normal page reading operation.
Figure 8B:
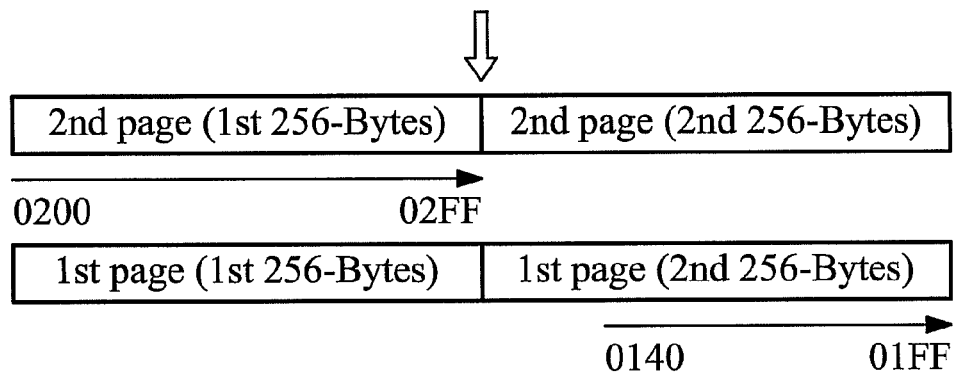
Figure 8C:
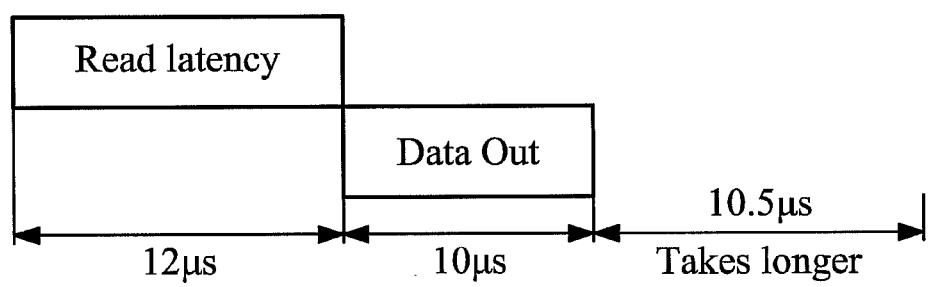
Figure 8D:
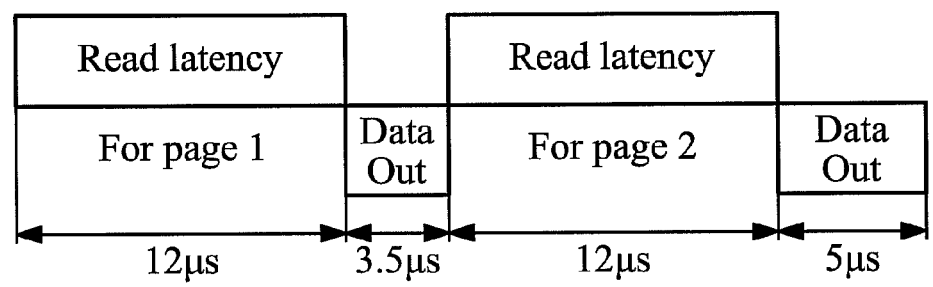
Figure 9B:
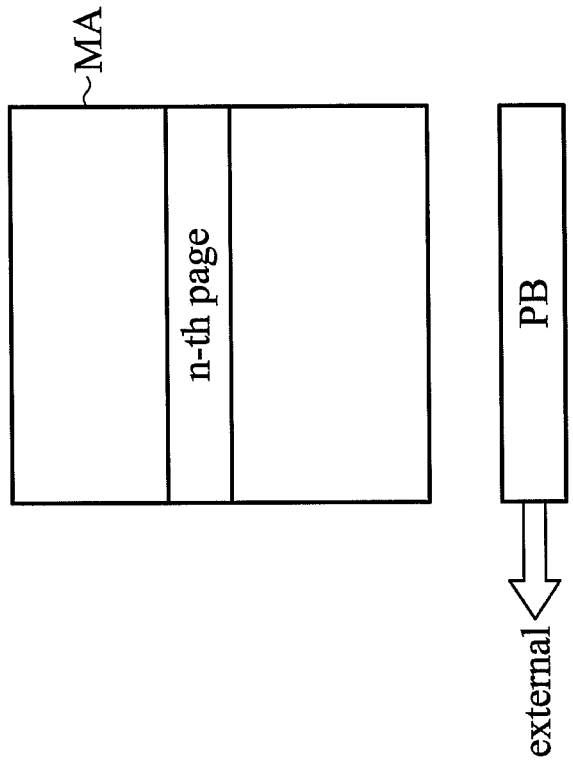
FIG. 9a-9d are schematic diagrams illustrating an embodiment of a reading operation of a conventional flash memory device.
Figure 9A:
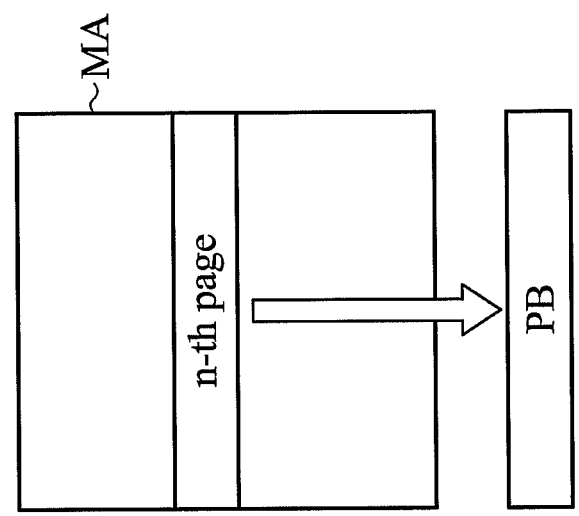
Figures 9C, 9D:
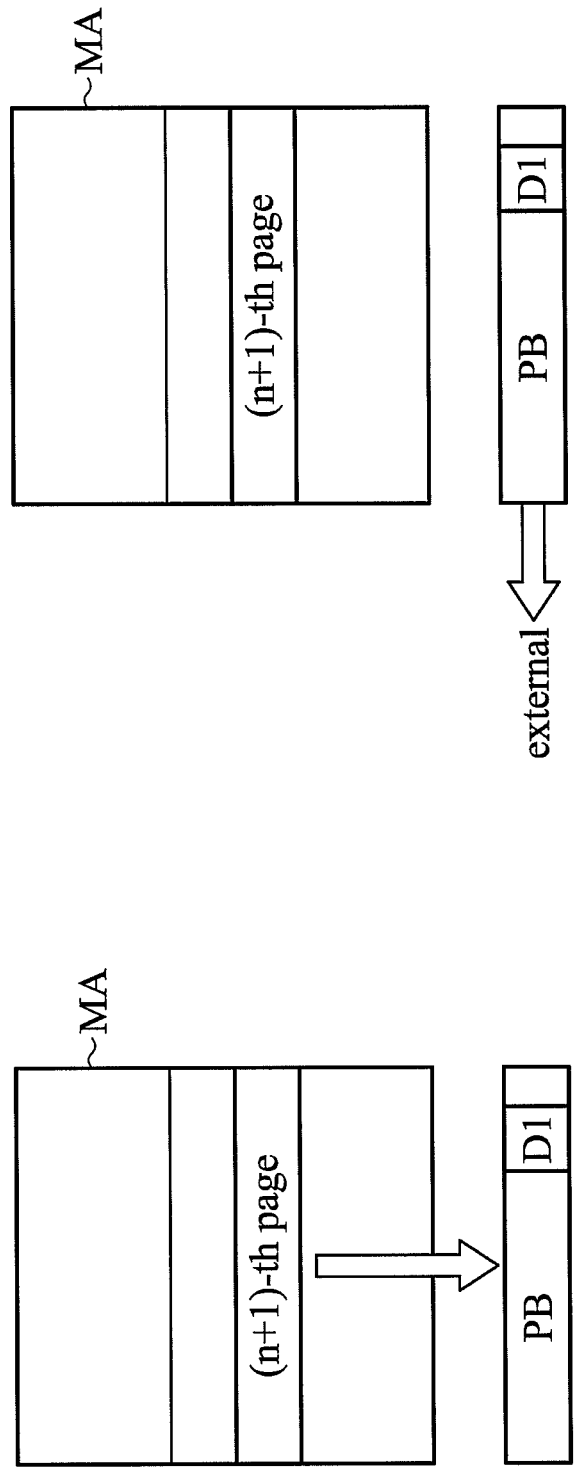

The reading operation of FIG. 8a-8b corresponds to FIG. 7a-7b. As shown in FIG. 8b, the wraparound reading operation from the first page to the second page is performed. As shown in FIG. 8d, 12 μs is needed to read the first page, and 3.5 μs is needed to output the data from page address "0140". 12 μs is needed to read the second page, and 5 μs is needed to output the data. Thus, 10.5 μs of additional time is needed by this way.

In the invention, the flexible page reading or the normal page reading are performed selectively. Thus, the speed of reading a page is improved.

In the embodiment described above, although the flexible page reading operation selects the n-th page and the (n+1)-th page for example, it is able to select the n-th page and the (n+2)-th page or other similar sets.

In the embodiment described above, although two memory banks simultaneously are accessed for example, the number of memory banks to access may be more than two. For example, while four memory banks of a flash memory are capable for simultaneous access and a flexible page reading operation can be performed, different pages (such as the n-th page, the (n+1)-th page, the (n+2)-th page, the (n+3)-th page) can be selected or some pages can be repeat such as the n-th page, the n-th page, the (n+1)-th page, the (n+1)-th page. The combination of pages can be selected according to user requirements.

While the invention has been described by way of example and in terms of preferred embodiment, it is to be understood that the invention is not limited thereto. Therefore, the scope of the present invention shall be defined and protected by the following claims and their equivalents.

What is claimed is:

1. A semiconductor memory device, comprising:
   a memory cell array having at least two memory banks, wherein the memory banks can be accessed simultaneously, each of the memory banks comprises a plurality of memory cells formed in columns and rows, wherein gates of each row of the memory cells are coupled to each word line in common respectively, and each column of the memory cells is coupled to each bit line respectively;
   a first receive device for receiving address information;
   a second receive device for receiving a command related to an access operation;
   a word line selection device for decoding column address information received by the first receive device, and selecting a word line according to a decoding result; and
   a controller device controlling the word line selection device according to the command received by the second receive device,
   wherein, the controller device instructs the word line selection device to perform a first read operation according to a first read command, and instructs the word line selection device to perform a second read operation according to a second read command;
   wherein, the first read operation selects the n-th word line of one of the memory banks and selects the (n+1)-th or (n−1)-th word line of the other one of the memory banks, and
   wherein, the second read operation selects the n-th word line of one of the memory banks and selects the n-th word line of the other one of the memory banks.

2. The semiconductor memory device of claim 1, wherein the n-th word line is adjacent to the (n+1)-th or (n−1)-th word line in a row direction of the memory banks.

3. The semiconductor memory device of claim 1, wherein the controller device further determines whether the column address information received by the first receive device is within a column address range of the other one of the memory banks, and instructs the word line selection device to perform the first read operation according to the first read command when the column address information is within the column address range.

4. The semiconductor memory device of claim 1, wherein the controller device instructs the word line selection device to perform the second read operation without basing on the first read command when the row address information is not within the column address range.

5. The semiconductor memory device of claim 1, further comprising a first page register and a second page register coupled to each of the memory banks via bit lines respectively, wherein the first page register stores data read by the first read operation, and the second page register stores data read by the second read operation.

6. The semiconductor memory device of claim 1, further comprising a column selection device for decoding a column address signal, and selecting data of a first page register and a second page register according to the decoding result.

7. The semiconductor memory device of claim 1, wherein the semiconductor memory device is a NAND flash memory.

8. A memory device reading program for a semiconductor memory device, wherein the semiconductor memory device comprises a memory cell array having at least two memory banks, wherein the memory banks can be accessed simultaneously, each of the memory banks comprise a plurality of memory cells formed in columns and rows, wherein the gates of each row of the memory cells are coupled to each word line in common respectively, each column of the memory cells is coupled to each bit line respectively, and having a word line selection device selecting a word line according to a decoding result row address information, comprising the steps of:

identifying a read command is a first read command or a second read command;

if the read command is the first read command, performing a first read operation by the word line selection device; and if the read command is the second read command, performing a second read operation by the word line selection device, wherein the first read operation selects the n-th word line of one of the memory banks and selects the (n+1)-th or (n−1)-th word line of the other one of the memory banks, and wherein the second read operation selects the n-th word line of one of the memory banks and selects the n-th word line of the other one of the memory banks.

9. The memory device reading program of claim 8, further comprising:

determining whether column address information received by a first receive device is within a column address range of the other one of the memory banks; and setting a first flag information when the column address information is within the column address range, and setting a second flag information when the column address information is not within the column address range, wherein the first read operation is performed when the first command is received and the first flag information is set, and the second read operation is performed when the second command is received and the second flag information is set.

10. A semiconductor memory device reading method for a semiconductor memory device, wherein the semiconductor memory device comprises: a memory cell array having at least two memory banks, wherein the memory banks can be accessed simultaneously, each of the memory banks comprise a plurality of memory cells formed in columns and rows, wherein gates of each row of the memory cells are coupled to each word line in common respectively, each column of the memory cells is coupled to each bit line respectively, and having a word line selection device selecting a word line according to a decoding result row address information, comprising the steps of:

identifying a read command is a first read command or a second read command;

if the read command is the first read command, performing a first read operation by the word line selection device; and if the read command is the second read command, performing a second read operation by the word line selection device, wherein the first read operation selects the n-th word line of one of the memory banks and selects the (n+1)-th or (n−1)-th word line of the other one of the memory banks, and wherein the second read operation selects the n-th word line of one of the memory banks and selects the n-th word line of the other one of the memory banks.

11. The semiconductor memory device reading method of claim 10, further comprising:

determining whether column address information received by a first receive device is within a column address range of the other one of the memory banks; and setting a first flag information when the column address information is within the column address range, and setting a second flag information when the column address information is not within the column address range, wherein the first read operation is performed when the first command is received and the first flag information is set, and the second read operation is performed when the second command is received and the second flag information is set.

* * * * *